United States Patent
Kabir

(10) Patent No.: US 10,680,435 B2
(45) Date of Patent: Jun. 9, 2020

(54) ENHANCED ELECTROSTATIC DISCHARGE (ESD) CLAMP

(71) Applicant: Intersil Americas LLC, Milpitas, CA (US)

(72) Inventor: Abu T. Kabir, West Melbourne, FL (US)

(73) Assignee: Intersil Americas LLC, Milpitas, CA (US)

( * ) Notice: Subject to any disclaimer, the term of this patent is extended or adjusted under 35 U.S.C. 154(b) by 359 days.

(21) Appl. No.: 15/492,906

(22) Filed: Apr. 20, 2017

(65) Prior Publication Data

US 2017/0310104 A1    Oct. 26, 2017

Related U.S. Application Data

(60) Provisional application No. 62/469,894, filed on Mar. 10, 2017, provisional application No. 62/327,719, filed on Apr. 26, 2016.

(51) Int. Cl.
*H02H 9/04* (2006.01)
*H01L 27/02* (2006.01)

(52) U.S. Cl.
CPC ......... *H02H 9/046* (2013.01); *H01L 27/0277* (2013.01); *H01L 27/0288* (2013.01)

(58) Field of Classification Search
CPC ................. H01L 27/0277; H01L 27/0288
USPC ........................................................ 361/56
See application file for complete search history.

(56) References Cited

U.S. PATENT DOCUMENTS

| | | | | |
|---|---|---|---|---|
| 7,203,050 B2* | 4/2007 | Cheng | ............ | H01L 27/0259 327/432 |
| 7,508,639 B2* | 3/2009 | Wu | ............ | H01L 27/0266 361/111 |
| 9,019,666 B2* | 4/2015 | Bourgeat | ............ | H01L 23/60 257/355 |

OTHER PUBLICATIONS

Denison, Marie et al., "Analysis and modeling of DMOS FBSOA limited by n-p-n leakage diffusion current", Proceedings of the 17th International Symposium on Power Semiconductor Devices & IC's, May 23-26, 2005, 4 pages.

Rumennik, Vladimir et al., "Integrated High and Low Voltage CMOS Technology", 1982 International Electron Devices Meeting, Dec. 13-15, 1982, 4 pages.

* cited by examiner

*Primary Examiner* — Dharti H Patel
(74) *Attorney, Agent, or Firm* — Foley & Lardner LLP

(57) ABSTRACT

An enhanced ESD clamp is provided with a resistor connected between the body terminal and the source terminal of a MOSFET device. In one exemplary embodiment, the MOSFET device is a grounded-gate NMOS (ggNMOS) transistor device with the resistor ("body resistor") connected externally to the MOSFET device. In another embodiment, the MOSFET device is a ggPMOS transistor device. In yet another embodiment, the body resistor is disposed within and connected internally to the MOSFET device. In any event, the resistance value of the body resistor determines the level to which the trigger voltage of the ESD clamp will be reduced when an ESD event occurs.

6 Claims, 4 Drawing Sheets

ENHANCED ELECTROSTATIC DISCHARGE (ESD) CLAMP

CROSS-REFERENCE TO RELATED APPLICATIONS

This application claims priority to U.S. Provisional Patent Application Ser. No. 62/327,719, filed on Apr. 26, 2016, and to U.S. Provisional Patent Application Ser. No. 62/469,894, filed on Mar. 10, 2017, the contents of all such applications being incorporated herein by reference in their entirety.

TECHNICAL FIELD

The present embodiments relate generally to electrostatic discharge (ESD) protection, and more particularly to an enhanced ESD clamp for an integrated circuit.

BACKGROUND

Metal-Oxide Semiconductor Field-Effect Transistor (MOSFET) devices are often utilized for Electrostatic Discharge (ESD) protection within CMOS integrated circuits to clamp any large ESD-induced voltage pulse to a level low enough to avoid damaging the semiconductor devices and/or metal interconnects in the integrated circuit chips involved. However, existing MOSFET-based clamps utilized for ESD protection are incapable of protecting any semiconductor device that has a turn-on voltage that is lower than the trigger voltage of the ESD clamp being utilized.

SUMMARY

Embodiments provide an enhanced ESD clamp with a resistor connected between the body terminal and the source terminal of a MOSFET device. In one exemplary embodiment, the MOSFET device is a grounded-gate NMOS (ggNMOS) transistor device with the resistor ("body resistor") connected externally to the MOSFET device. In another embodiment, the MOSFET device is a ggPMOS transistor device. In yet another embodiment, the body resistor is disposed within and connected internally to the MOSFET device. In any event, the resistance value of the body resistor determines the level to which the trigger voltage of the ESD clamp will be reduced when an ESD event occurs. Consequently, a circuit designer or fabricator can select a suitable resistance value for a body resistor that will reduce the trigger voltage of the ESD clamp to a level that is lower than the turn-on voltage of any semiconductor device in the integrated circuit involved if an ESD event should occur.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1A:
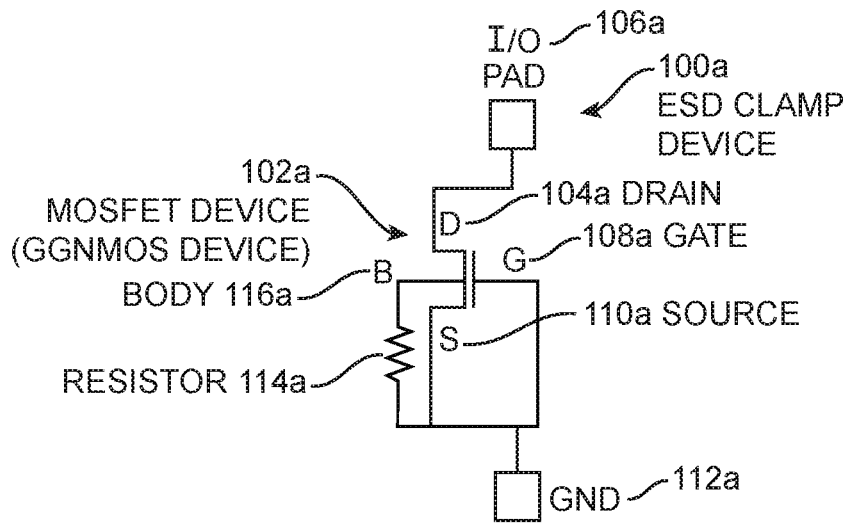
FIGS. 1A and 1B are related schematic circuit diagrams depicting an ESD clamp device for enhanced ESD protection that can be utilized to implement one exemplary embodiment of the present invention.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Metal-Oxide Semiconductor Field-Effect Transistor (MOSFET) devices are often utilized for Electrostatic Discharge (ESD) protection within CMOS integrated circuits to clamp any large ESD-induced voltage pulse to a level low enough to avoid damaging the semiconductor devices and/or metal interconnects in the integrated circuit chips involved. However, existing MOSFET-based clamps utilized for ESD protection are incapable of protecting any semiconductor device that has a turn-on voltage that is lower than the trigger voltage of the ESD clamp being utilized. Consequently, the semiconductor devices and thus the integrated circuit chips can fail if an ESD event occurs. Nevertheless, as described below, notwithstanding the above-described problems with existing MOSFET-based ESD clamps, the present invention resolves these and other related problems with a novel MOSFET-based ESD clamp and method for enhanced ESD protection in integrated circuits, wafers, chips and dice.

Embodiments of the present invention provide an enhanced ESD clamp with a resistor connected between the body terminal and the source terminal of a MOSFET device. In one exemplary embodiment, the MOSFET device is a grounded-gate NMOS (ggNMOS) transistor device with the resistor ("body resistor") connected externally to the MOSFET device. In another embodiment, the MOSFET device is a ggPMOS transistor device. In yet another embodiment, the body resistor is disposed within and connected internally to the MOSFET device. In any event, the resistance value of the body resistor determines the level to which the trigger voltage of the ESD clamp will be reduced when an ESD event occurs. Consequently, a circuit designer or fabricator can select a suitable resistance value for a body resistor that will reduce the trigger voltage of the ESD clamp to a level that is lower than the turn-on voltage of any semiconductor device in the integrated circuit involved if an ESD event should occur.

FIG. 1A depicts a schematic circuit diagram of an enhanced ESD clamp device 100a, which can be utilized to implement one exemplary embodiment of the present invention. Referring to the exemplary embodiment depicted in FIG. 1A, the ESD clamp device 100a includes a MOSFET device 102a. For this exemplary embodiment, the MOSFET device 102a is a ggNMOS transistor device. However, in another embodiment, any suitable MOS transistor device (e.g., NMOS or PMOS) can be utilized to implement the MOSFET device 102a. For example, the MOSFET device 102a can be a P-MOSFET device instead of an N-MOSFET device, if the beta value of the corresponding parasitic PNP bipolar transistor in the ggPMOS transistor is sufficiently high. Returning to FIG. 1A, the drain terminal 104a of the MOSFET device 102a is connected to an input/output (I/O) pad 106a, and the gate terminal 108a and source terminal 110a of the MOSFET device 102a are connected to a ground contact 112a. For example, the I/O pad 106a can be connected to an input port or pin of an integrated circuit to be protected from an ESD event (e.g., static discharge on that port or pin). A resistor 114a ("body resistor") is connected to the body terminal 116a and the ground contact 112a. Notably, the resistance value of the resistor 114a connected between the body terminal 116a and the ground contact 112a of the MOSFET device 102a is selected to reduce the trigger voltage of the ESD clamp device 100a to a suitable level so that the ESD clamp device 100a can protect each semiconductor device that would normally have a lower turn-on voltage than the trigger voltage of the ESD clamp device 100a if an ESD event were to occur.

Figure 1B:
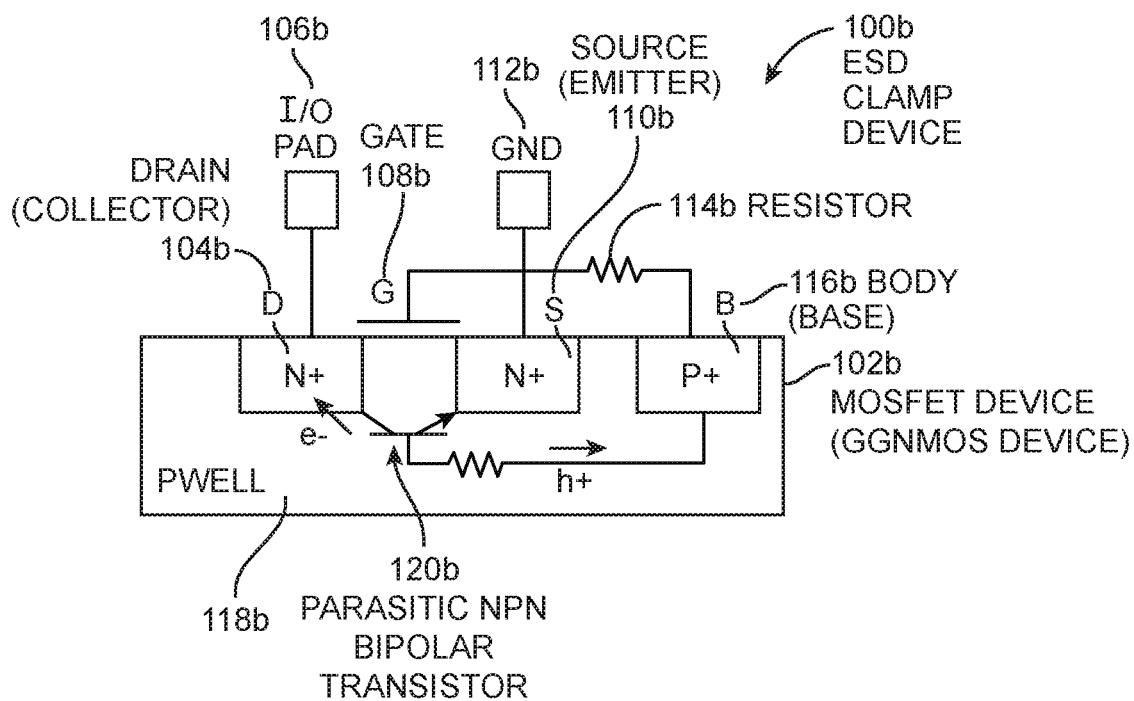

FIG. 1B depicts a side elevation, cross-sectional view of the ESD clamp device 100a depicted in FIG. 1A. Referring to the exemplary embodiment depicted in FIG. 1B, the ESD clamp device 100b includes a MOSFET device 102b. For this exemplary embodiment, the MOSFET device 102b is a ggNMOS transistor device. However, in another embodiment, any suitable MOS transistor device (e.g., NMOS or PMOS) FET can be utilized to implement the MOSFET device 102b. For example, the MOSFET device 102b can be a P-MOSFET device instead of an N-MOSFET device, if the beta value of the corresponding parasitic PNP bipolar transistor in the ggPMOS transistor is sufficiently high. Returning to the exemplary embodiment depicted in FIG. 1B, the MOSFET device 102b is formed in a lightly doped, deep P-well region 118b that isolates the MOSFET device 102b from an N-type semiconductor substrate (i.e., P-type background doping). For example, the P-well region 118b can be formed by implanting dopants into a surface of a region or layer of semiconductor material having an N-type conductivity utilizing a suitable implantation process. However, if the MOSFET device 102b is a ggPMOS transistor device in a different embodiment, the MOSFET device 102b could be formed in a lightly doped, deep N-well region that would isolate the MOSFET device 102b from a P-type semiconductor substrate (N-type background doping).

For this embodiment, the drain 104b of the MOSFET device 102b has an N+ conductivity and is connected to the I/O pad 106b. The gate 108b of the MOSFET device 102b is connected to the ground contact 112b, which in turn, can be connected to the circuit ground of the integrated circuit to be protected from an ESD event. The source 110b of the MOSFET device 102b has an N+ conductivity and is also connected to the ground contact 112b. The body 116b of the MOSFET device 102b has a P+ conductivity and is connected to a first end of the body resistor 114b, and the second end of the body resistor 114b is connected to the ground contact 112b. Notably, during an occurrence of an ESD event, the drain 104b, gate 108b and source 110b, respectively, form the collector (104b), base (108b) and emitter (110b) of the parasitic NPN bipolar transistor 120b in the ggNMOS transistor device 102b when the ggNMOS transistor device 102b is triggered and turned on.

In an exemplary operation of the ESD clamp device 100b, referring to FIG. 1B, if no ESD event has occurred in the circuit being protected (e.g., "normal" operation), the ESD clamp device 100b remains "off" (e.g., inactive or non-conducting) while the gate-to-source voltage, Vgs, of the MOSFET device 102b remains substantially equal to 0V. However, if an ESD event occurs (e.g., static discharge) on the protected integrated circuit's input (or output) pin connected to the I/O pad 106b, the parasitic NPN bipolar transistor 120b formed by the drain 104b (i.e. collector of parasitic transistor 120b), body 116b (i.e., base of parasitic transistor 120b) and source 110b (i.e., emitter of parasitic transistor 102b) is turned "on" (e.g., active or conducting) when the voltage across the drain-to-body junction of the MOSFET device 102b reaches the avalanche breakdown voltage level. At that point, the migrating holes (indicated by the arrow labeled h+), which result from the ionization impact of the drain-to-body junction breakdown of the MOSFET device 102b, induce a bipolar action in the MOSFET device by increasing the voltage across the body-to-source junction, which causes the parasitic NPN bipolar transistor 120b to turn "on". As a result, the voltage drop across the body resistor 114b is increased. Consequently, the base-to-emitter junction of the parasitic NPN bipolar transistor 120b reaches the forward bias voltage level at a significantly lower drain-to-source voltage level than usual, which in turn significantly decreases the trigger voltage level of the ESD clamp device 100b. Therefore, as depicted graphically by the diagram in FIG. 2 (described below), the resistance value of the body resistor 114b can be selected to determine the desired trigger voltage level for the ESD clamp device 100b.

Figure 2:
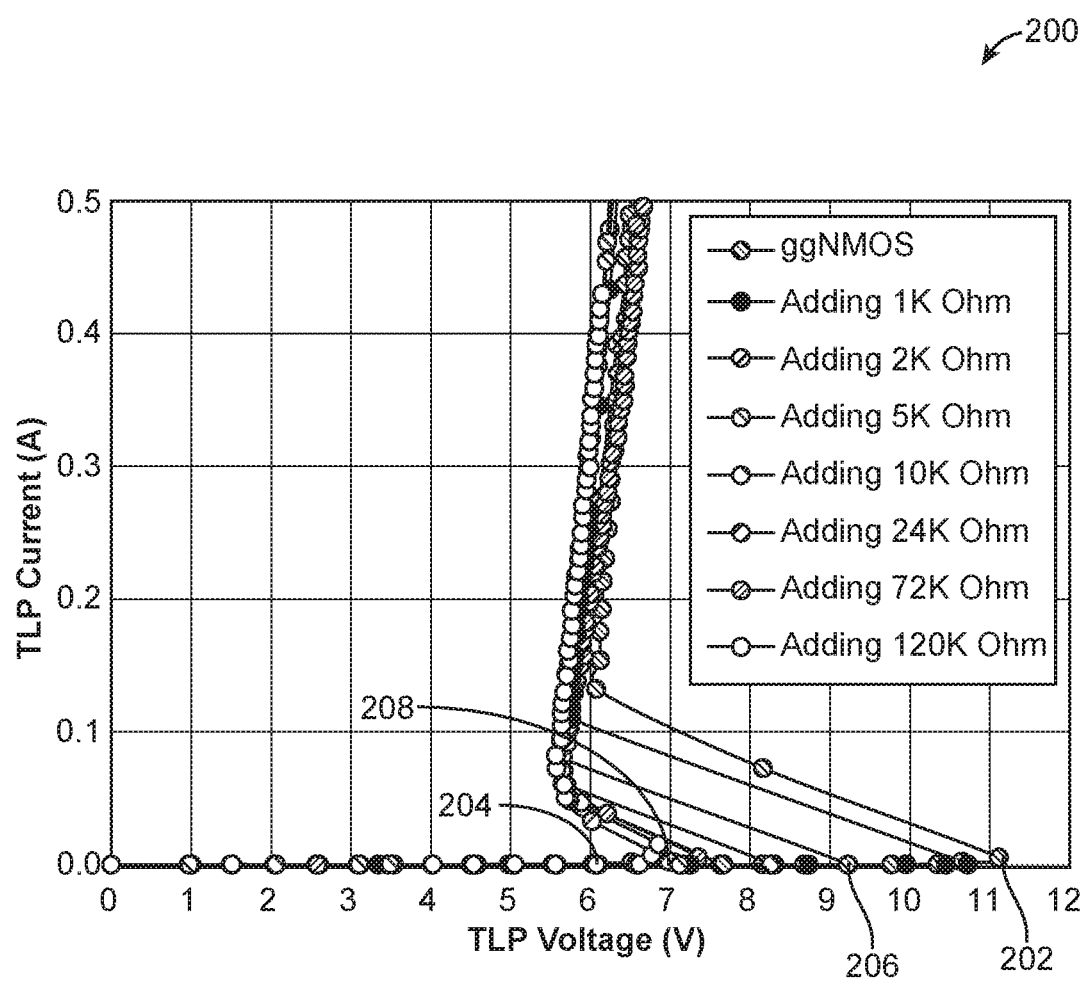
FIG. 2 is a graph depicting Transmission Line Pulse (TLP) current (A) versus voltage (V) measurement curves for a plurality of body resistor resistance values that can be applied to an ESD clamp device that is configured in accordance with one exemplary embodiment of the present invention.

FIG. 2 is a diagram 200 depicting exemplary Transmission Line Pulse (TLP) current (A) versus voltage (V) measurement curves for a plurality of body resistor resistance values that can be applied to an ESD clamp device, which is configured in accordance with one exemplary embodiment of the present invention. For example, the diagram 200 depicted in FIG. 2 indicates at points 202 and 204 that the trigger voltage (V) of the ggNMOS ESD clamp device being utilized varied from approximately 11.0V to 6.85V as the resistance value of the body resistor was increased. Also, for example, the points 206 and 208 in FIG. 2 indicate that the trigger voltage (V) of the ggNMOS ESD clamp device being utilized decreased from approximately 9.5V to 7.0V when a 25 KΩ body resistor was applied (e.g., connected between the body terminal 116b and source terminal 110b).

Figure 3:
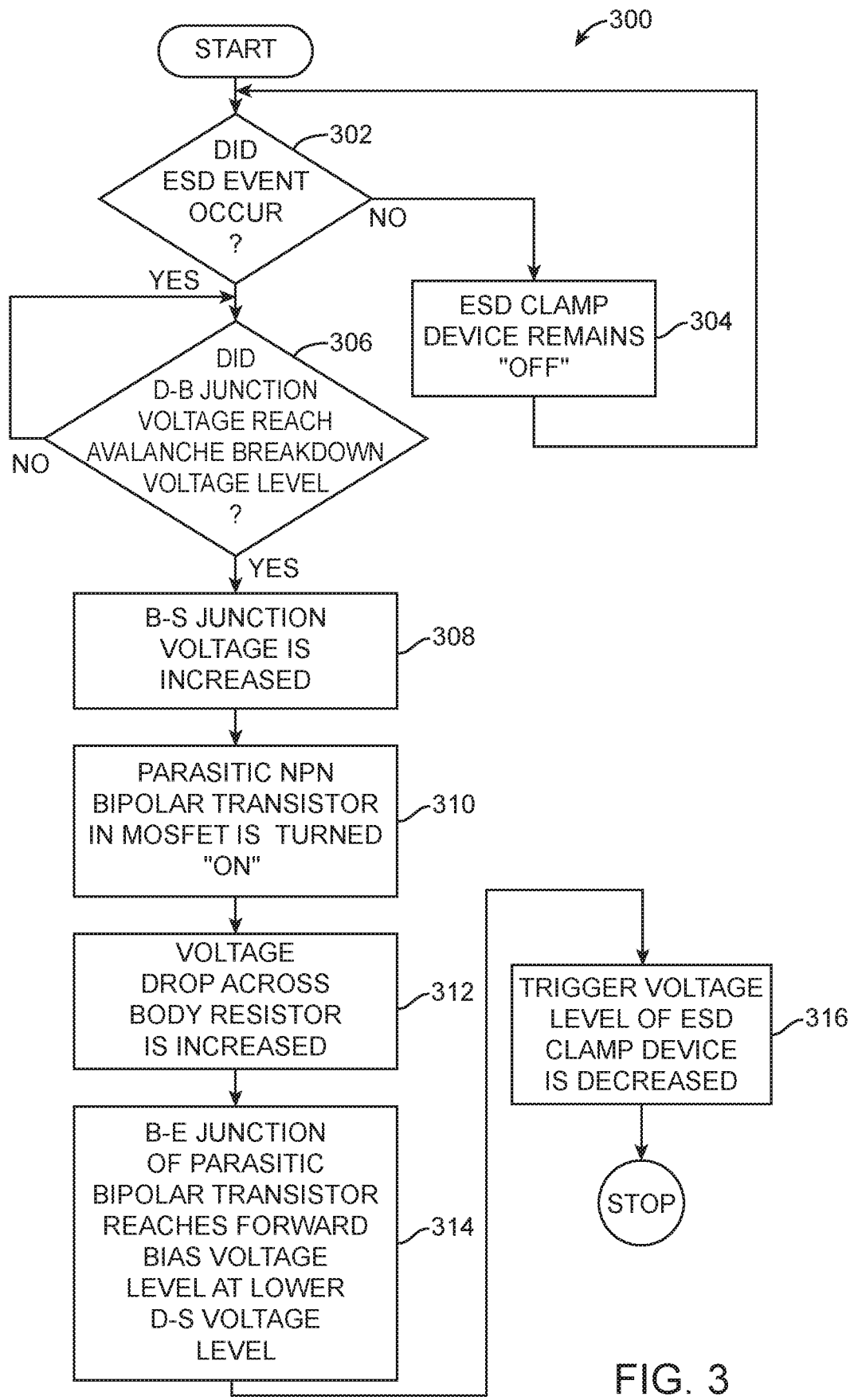
FIG. 3 depicts a flow diagram of a method of operation of an ESD clamp device for enhanced ESD protection, in accordance with one exemplary embodiment of the present invention.

FIG. 3 depicts a flow diagram of a method of operation 300 of an ESD clamp device for enhanced ESD protection, in accordance with one exemplary embodiment of the present invention. Referring to FIGS. 1B and 3 for this exemplary embodiment, the method 300 begins with the ESD clamp device 100b in an "off" state and awaiting an occurrence of an ESD event (302) on the I/O pad 106b. If an ESD event has not occurred, the ESD clamp device 100b remains in the "off" state (304), and the flow returns to 302. However, at 302, if an ESD event (e.g., static discharge) has occurred, the method determines if the drain-to-body junction voltage of the MOSFET device 102b has reached the avalanche breakdown voltage level (306). If not, the flow returns to 306. However, at 306, if the drain-to-body junction voltage of the MOSFET device 102b has reached the avalanche breakdown voltage level, the body-to-source junction voltage of the MOSFET device 102b is increased (308), and the parasitic NPN bipolar transistor 120b in the MOSFET device 102b is turned "on" (310). Consequently, the voltage drop across the body resistor 114b is increased (312), and the base-to-emitter junction of the parasitic NPN bipolar transistor 102b reaches its forward bias voltage level at a lower drain-to-source voltage level of the MOSFET device 102b than usual (314), which in turn decreases the trigger voltage level of the ESD clamp device 100b (316). Therefore, the method 300 enables a user to select a resistance value of the body resistor 114b in order to determine the desired trigger voltage level for the ESD clamp device 100b.

Figure 4:
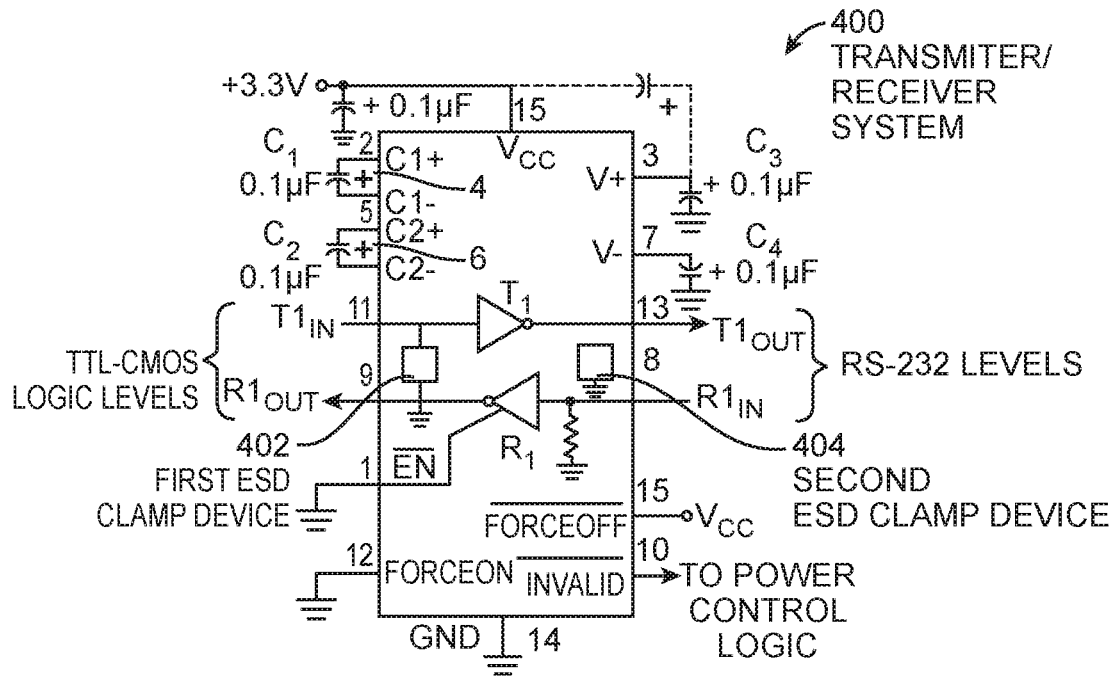
FIG. 4 depicts a schematic, block diagram of an exemplary transmitter/receiver system that can be utilized to implement an ESD clamp device for enhanced ESD protection, in accordance with one or more embodiments of the present invention.

FIG. 4 depicts a schematic, block diagram of an exemplary transmitter/receiver system 400 that can be utilized to implement an ESD clamp device for enhanced ESD protection, in accordance with one or more embodiments of the present invention. In some embodiments, transmitter/receiver system 400 can be implemented as a semiconductor IC or chip. Referring to FIG. 4 for one exemplary embodiment, transmitter/receiver system 400 includes a transmitter T1 and a receiver R1. In other embodiments, transmitter/receiver system 400 can include a plurality of transmitters and receivers in a semiconductor IC or chip. In any event, the I/O pad (e.g., 106b in FIG. 1B) of a first ESD clamp device 402 for enhanced ESD protection is connected to the input connection T1IN of the transmitter T1, and the ground contact (e.g., 112b in FIG. 1B) of the first ESD clamp device 402 is connected to circuit ground. Also, the I/O pad (e.g., 106b in FIG. 1B) of a second ESD clamp device 404 for enhanced ESD protection is connected to the output connection T1OUT of the transmitter T1, and the ground contact (e.g., 112b in FIG. 1B) of the second ESD clamp device 404 is connected to circuit ground. Furthermore, a plurality of other ESD clamp devices for enhanced ESD protection can be connected to other circuit components of the transmitter/receiver system 400 between their respective pin connections and ground. If an ESD event occurs on the input connection T1IN or the output connection T1OUT, for example, the corresponding ESD clamp device is triggered and turned on.

Figure 5:
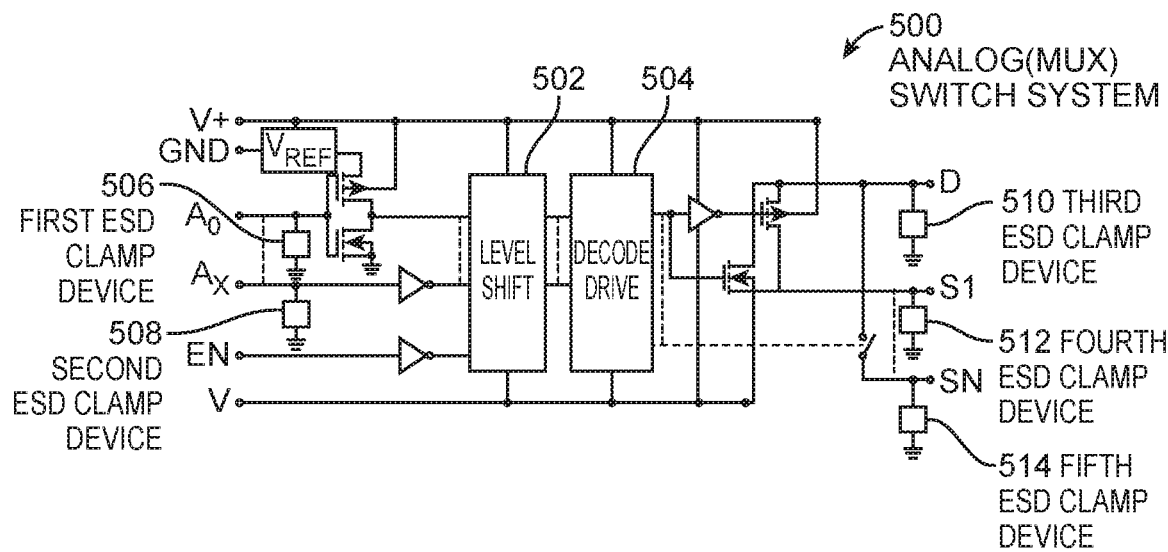
FIG. 5 depicts a schematic, block diagram of an exemplary analog switch configured as a multiplexer/demultiplexer (e.g., MUX switch) system that can be utilized to implement an ESD clamp device for enhanced ESD protection, in accordance with one or more embodiments of the present invention.

FIG. 5 depicts a schematic, block diagram of an exemplary analog switch configured as a multiplexer/demultiplexer (e.g., MUX switch) system 500 that can be utilized to implement an ESD clamp device for enhanced ESD protection, in accordance with one or more embodiments of the present invention. In some embodiments, MUX switch system 500 can be implemented on a semiconductor IC or chip. Referring to FIG. 5 for one exemplary embodiment, MUX switch system 500 includes (among other components) a level shift unit 502 and a decoder/driver unit 504. In the exemplary embodiment shown, the I/O pad (e.g., 106b in FIG. 1B) of a first ESD clamp device 506 for enhanced ESD protection is connected to the input connection $A_0$, and the ground contact (e.g., 112b in FIG. 1B) of the first ESD clamp device 506 is connected to circuit ground. Also, the I/O pad of a second ESD clamp device 508 for enhanced ESD protection is connected to the input connection $A_X$, and the ground contact of the second ESD clamp device is connected to circuit ground. Additional ESD clamp devices for enhanced ESD protection can be connected between each of the other input connections $A_1$ to $A_{X-1}$ and circuit ground. For example, a third ESD clamp device 510 for enhanced ESD protection is connected between the main output connection D and circuit ground, a fourth ESD clamp device 512 for enhanced ESD protection is connected between the main multiplexor connection $S_1$ and circuit ground, and a fifth ESD clamp device 514 for enhanced ESD protection is connected between the main multiplexor connection $S_N$ and circuit ground. Additional ESD clamp devices for enhanced ESD protection can be connected between the other main multiplexor connections $S_2$ to $S_{N-1}$ and circuit ground. Also, a plurality of other ESD clamp devices for enhanced ESD protection can be connected to other circuit components of the MUX switch system 500 between their respective pin connections and ground. If an ESD event occurs on any one of the inputs or outputs shown, the attached ESD clamp device is triggered and turned on.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method of operation of an ESD clamp device to protect a circuit, comprising:
   in a normal circuit operation, maintaining the ESD clamp device in an off state; and
   during an ESD event for the circuit, when a drain-to-body junction voltage of a MOSFET device in the ESD clamp device reaches a breakdown voltage level, increasing a body-to-source junction voltage of the MOSFET device until a parasitic transistor in the MOSFET device is turned on; and
   increasing a voltage drop across a resistor coupled between a source terminal and a body terminal of the MOSFET device until a base-to-emitter junction voltage of the parasitic transistor reaches a forward bias voltage level that is lower than a drain-to-source voltage level of the MOSFET device.

2. The method of claim 1, wherein the increasing the body-to-source junction voltage of the MOSFET device until the parasitic transistor in the MOSFET device is turned on comprises:
   increasing the body-to-source junction voltage of the MOSFET device until a parasitic NPN bipolar transistor in the MOSFET device conducts.

3. The method of claim 1, wherein the increasing the body-to-source junction voltage of the MOSFET device until the parasitic transistor in the MOSFET device is turned on comprises:

increasing the body-to-source junction voltage of the MOSFET device until a parasitic PNP bipolar transistor in the MOSFET device conducts.

4. The method of claim 1, wherein the increasing the voltage drop across the resistor coupled between the source terminal and the body terminal of the MOSFET device until the base-to-emitter junction voltage of the parasitic transistor reaches the forward bias voltage level that is lower than the drain-to-source voltage level of the MOSFET device comprises:

decreasing a trigger level of the ESD clamp device.

5. The method of claim 1, wherein the increasing the body-to-source junction voltage of the MOSFET device until the parasitic transistor in the MOSFET device is turned on comprises:

increasing a body-to-source junction voltage of a grounded gate N-MOSFET (ggNMOS) device until a parasitic NPN bipolar transistor in the ggNMOS device conducts.

6. The method of claim 1, wherein the increasing the body-to-source junction voltage of the MOSFET device until the parasitic transistor in the MOSFET device is turned on comprises:

increasing a body-to-source junction voltage of a grounded gate P-MOSFET (ggPMOS) device until a parasitic PNP bipolar transistor in the ggPMOS device conducts.

\* \* \* \* \*